United States Patent [19]

Kato et al.

[11] Patent Number: 4,645,566

[45] Date of Patent: Feb. 24, 1987

[54] PROCESS FOR PRODUCING ELECTROCONDUCTIVE FILMS

[75] Inventors: Ippei Kato, Sunto; Masao Takasu, Fuji; Nobuo Maruyama, Tokyo, all of Japan

[73] Assignees: Mushima Paper Co., Ltd., Shizuoka; Kureha Chemical Industry Co., Ltd., Tokyo, both of Japan

[21] Appl. No.: 694,638

[22] Filed: Jan. 24, 1985

[30] Foreign Application Priority Data

Jan. 27, 1984 [JP] Japan .................................. 59-11985
Nov. 15, 1984 [JP] Japan ................................ 59-239561

[51] Int. Cl.$^4$ ............................................. D21H 5/18
[52] U.S. Cl. .................................... 162/138; 162/146; 162/206; 162/207
[58] Field of Search ..................... 162/138, 146, 157.1, 162/206, 207

[56] References Cited

U.S. PATENT DOCUMENTS

| | | | |
|---|---|---|---|
| 3,265,557 | 8/1966 | De Fries et al. | 162/146 |
| 3,957,573 | 5/1976 | Miyamoto et al. | 162/146 |

FOREIGN PATENT DOCUMENTS

| | | | |
|---|---|---|---|
| 48-15684 | 5/1973 | Japan . | |
| 56-41760 | 9/1981 | Japan . | |
| 58-163800 | 9/1983 | Japan | 162/157.1 |
| 1410107 | 9/1973 | United Kingdom . | |

*Primary Examiner*—Peter Chin
*Attorney, Agent, or Firm*—Wenderoth, Lind & Ponack

[57] ABSTRACT

A process for producing an electroconductive film having a volume resistivity of fiber oriented direction of not more than $1 \times 10^8$ ohm cm comprising mixing from 94.5% to 40% volume of a thermoplastic synthetic pulp with from 5% to 30% by volume of thermoplastic composite fibers comprising of a first component having a lower melting point than that of said thermoplastic synthetic pulp and a second component having a higher melting point than that of said thermoplastic synthetic pulp, and from 0.5% to 30% by volume of electroconductive fibers to prepare a paper stock; forming a wet web from the paper stock; heating and drying said wet web at a specific first temperature to melt the first component of the composite fibers, thereby forming a base paper; and thereafter heating said base paper under pressure at a specific second temperature to melt the thermoplastic synthetic pulp, thereby forming a film having dispersed said second component and said electroconductive fibers therein.

12 Claims, 7 Drawing Figures

PROCESS FOR PRODUCING ELECTROCONDUCTIVE FILMS

BACKGROUND OF THE INVENTION

This invention relates to a process for producing an electroconductive film which is used as films for packaging products of electronic components, in-process dust-proof films or electromagnetic wave-shielding films for electronic equipments. More particularly, this invention relates to a process capable of producing an electroconductive film wherein the resulting film is relatively thin, wherein the film can be continuously produced and wherein the resulting film has a sufficient conductivity and an excellent strength even if the basis weight thereof is low.

It is necessary to protect products such as electronic components such as semiconductor IC and LSI, printed boards and magnetic tapes from the adsorption of dust by virtue of static electricity and troubles by virtue of static electrification, during packaging and delivery. In particular, MOS-type IC and the like tend to occur dielectric breakdown by virtue of static electricity, antistatic treatment is essential. In order to protect products from these static troubles, the products may be packaged with an electroconductive film having a low surface resistivity. Because it is desired that the products such as IC described above can be judged by seeing through the film the packaged contents for the purpose of transactions, it is required that the electroconductive film per se has some transparency when the products are packaged with the electroconductive film.

In producing such an electroconductive film, it is necessary to meet the requirements of conductivity and transparency. In addition to the foregoing, it is necessary that films having a thickness as thin as possible can be obtained in order to retain a more excellent transparency and exhibit a flexibility, and that the sheet-shaped film having a strength sufficient to occur no rupture in process steps can be continuously produced.

Further, in industrial fields of electronic equipments, such as computers and instruments, it is necessary to use an electroconductive film having the functions of static electricity shielding and electromagnetic wave-shielding in an assembly step and the like. While transparency is not necessarily required in these uses, the sufficient conductivity and the product strength are required. Further, it is desired that the sheet-shaped film is continuously produced.

Heretofore, there has been proposed a process for manufacturing an electrocondutive polyolefin material which comprises the steps of incorporating carbon fibers into a pulp of a polyolefin-based material to form a paper stock, and thermally setting the sheet material by heating to a temperature above the melting point of the polyolefin component. (Japanese Patent Publication No. 13214/1977 corresponding to British Pat. No. 1,410,107.)

Further, there has been also proposed a process wherein carbon fibers are replaced by stainless steel fibers. (Japanese Patent Publication No. 41760/1981)

According to our experiments, the following has been found. When an electoconductive film consisting of polyolefinic synthetic pulp and carbon fibers or stainless steel fibers is produced, the polyolefinic synthetic pulp has not substantially physical or chemical bonding properties and therefore the tensile strength, tear strength and surface strength of the resulting sheet material are low. Further, the film can be broken in steps before thermal setting of polyolefin. Thus, it is practically difficult to continuously produce the sheet-shaped film while winding it. Furthermore, it was impossible to produce a product which is a thin film having a small basis weight and which has a sufficient conductivity and a high strength.

In order to compensate the shortage in strength, a single component binder such as hot water-soluble polyvinyl alcohol fibrous binder may be used in combination with the synthetic pulp. However, the melting point of the binder is too low and therefore the molten binder can adhere to the dryer of a paper machine. The foregoing tends to occur the adhesion of tailing onto the sheet, generation of holes and the breakage of paper, and therefore such a process is not preferred.

While the high strength can be obtained by melting the polyolefinic synthetic pulp at a dry part without using any reinforcing agent, many problems take place.

For example, the synthetic pulp exhibits a surface lifting immediately before the pulp melts, and heat melting becomes non-uniform. Further, partial elongation and wrinkle are generated. Eventually, it is impossible to obtain a film having a low basis weight and a high precision.

We have carried out studies in order to overcome the problems of the prior art processes. It has now been found that an electroconductive film having an excellent strength can be continuously produced by incorporating thermoplastic composite fibers described hereinafter into a polyolefinic synthetic pulp to form a paper stock, utilizing the characteristics of such composite fibers and controlling the heating temperature in process steps. We have now found optimum production conditions by means of experiments.

SUMMARY OF THE INVENTION

It is an object of the present invention to provide a process for continuously producing a thin electroconductive film having a high strength and excellent papermaking properties without any break in production steps and processing steps.

It is another object of the present invention to provide a process for producing a film having a sufficient conductivity even if it has a low basis weight.

It is a further object of the present invention to provide a process for producing an electroconductive film having an excellent transparency by the adjustment of marerials as needed.

The present invention relates to a process for producing an electroconductive film having a volume resistivity of fiber oriented direction of not more than $1 \times 10^8$ ohm cm which comprises the steps of forming a wet web by using a paper stock obtained by mixing from 94.5% to 40% by volume of a thermoplastic synthetic pulp with from 5% to 30% by volume of thermoplastic composite fibers comprising of a first component having a lower melting point than that of said thermoplastic synthetic pulp and a second component having a higher melting point than that of said thermoplastic synthetic pulp, and from 0.5% to 30% by volume of electroconductive fibers; therafter heating and drying said wet web at a temperature of not less than the melting point of said first component and below the melting point of said thermoplastic synthetic pulp to melt the first component, thereby forming a base paper wherein the paper stock components are adhered each other; and thereafter heating said base paper under pressure at a temperature of not less than the melting point of said thermoplastic synthetic pulp and below the melting point of said second component to melt the thermoplastic synthetic pulp, thereby forming a film having dispersed said second component and said electroconductive fibers therein.

DETAILED DESCRIPTION OF THE INVENTION

Thermoplastic Synthetic Pulps

Figure 1:
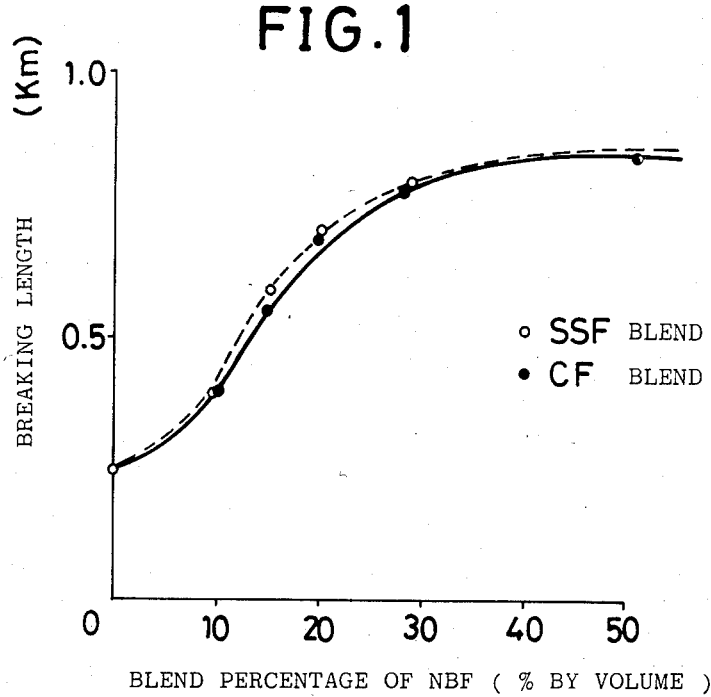
FIG. 1 is a graph representing the relationship between the blend percentage of thermoplastic composite fibers and the breaking length of a base paper.

By thermoplastic synthetic pulp as used herein is meant a papermaking fibrous material such as pulp comprising thermoplastic synthetic resins.

Thermoplastic synthetic resins include polyolefin, polyacrylonitrile, polyester, and polyamide. The thermoplastic synthetic resins can be any resins provided that they clarify in melting by heating, and retain its transparency when they are restored to solid polymeric materials by cooling. Of these, particularly preferred thermoplastic synthetic resins are relatively inexpensive polyolefins having a low melting point. The polyolefins include polyethylene, polypropylene, an ethylene-propylene copolymer, an ethylene- or propylene-alpha olefin copolymer, an ethylene- or propylene-vinyl acetate or acrylic acid copolymers, or mixtures thereof, or polymers obtained by chemically treating these polymers. If it is necessary to take into account the heat-sealing properties of an electroconductive film, the thermoplastic synthetic resins having a melting point of not more than 200° C., particularly not more than 170° C. are preferred.

Electroconductive Fibers

Electroconductive or conductive fibers which are used in the present invention include carbon fibers, various metallic fibers, metal-coated fibers wherein the surface of inorganic fibers such as carbon fibers and glass fibers is coated with metal. In addition to these fibers, it is possible to use materials capable of forming in the form of short fibers and having the small value of volume resistivity of fiber oriented direction, for example, those obtained by cutting a metal-deposited film in the form of fibers; and organic electroconductive fibers such as polyacetylene fibers.

While carbon fibers can be produced from any starting materials such as pitch, rayon and acrylonitrile, it is more preferred that the carbon fibers are graphite-like fibers or graphite fibers obtained by calcining them at a higher temperature than that used in producing conventional carbon fibers from the standpoint of an electroconductive film production. This is because the specific resistance of the carbon fibers may rapidly vary at its calcination temperature (from 1000° C. to 1400° C.) and thus they tend to occur the variability in quality. On the contrary, because the graphite-like fibers are calcined at higher temperatures, they exhibit little variability in specific resistance. Thus, the graphite-like fibers are stable and therefore suitable in the present invention. It is preferred that the carbon fibers are short fibers having a fiber length of from 1 to 40 mm and a diameter of from 5 to 30 μm (chopped fibers).

The metallic fibers include steel fibers, stainless steel fibers, aluminum fibers, brass fibers, copper fibers and bronze fibers. Stainless steel fibers, aluminum fibers, brass fibers and the like of which surface is not readily oxidized are readily handled and thus desirable. While these metallic fibers having various diameters are generally produced by means of a drawing process or the like, it is preferred that the metallic fibers which are used in the present invention have a diameter of from 1 to 40 μm, preferably not more than 20 μm and a fiber length of from 1 to 40 mm, preferably from 3 to 25 mm. If the diameter is more than 40 μm, the thickness of a film from which products are produced becomes ununiform and thus undesirable. Further, because of the weight of fibers, the fibers are liable to precipitate at one side of the film and thus the composition is liable to become ununiform. While fibers having a larger diameter afford a film having a low opacity, it is desirable that the diameter is not more than 20 μm in order to uniformly disperse the fibers in the base paper.

If the fiber length is less than 1 mm in the case of both carbon fibers and metallic fibers, it is difficult to form a network in the film by means of the fibers, and therefore the fiber length of less than 1 mm is not preferred. On the other hand, if the fiber length is more than 40 mm, a relatively wide range of fiber-free portion and extremely large fiber mass are formed in the electroconductive film, and therefore the fiber length of more than 40 mm is not preferred.

When metal-coated fibers (those obtained by coating carbon fibers or glass fibers with metal) are used, it is desirable that the metals to be coated are non-oxidizable metals such as aluminum and nickel.

The carbon fibers obtained by calcining at a relatively low temperature of about 1400° C. or below and graphite-like fibers obtained by calcining at higher temperature can be used as carbon fibers which are core materials. For example, it is possible to use, as the electroconductive fibers, the metal-coated fibers having a metal thickness of from about 0.5 to about 30 μm obtained by coating the surface of short fibers having a fiber length of from 1 to 40 mm and a diameter of from 5 to 30 μm with metals such as aluminum and nickel by means of processes such as electroless plating and vacuum deposition.

When glass fibers are used as core materials, it is possible to use commercially available metal-coated fibers having a metal thickness of from 3 to 5 μm obtained by coating chopped strands having a cut length of from 7 to 10 mm and a diameter of from about 10 to about 15 μm with metals such as aluminum and nickel by means of processes such as vacuum deposition and immersion in a metal bath.

If the blend percentage of the electroconductive fibers in a paper stock is too low, the contact of fibers is insufficient and an electroconductive film having a small volume resistivity of fiber oriented direction cannot be obtained. If the amount of the electroconductive fibers is too large, the strength of products is inferior and a uniform film is not readily obtained. The optimum blend percentage of the electroconductive fibers can vary depending upon the kind or diameter of the electroconductive fibers used. In order to obtain an electroconductive film having a volume resistivity of fiber oriented direction of not more than $1 \times 10^8$ ohm cm, the electroconductive fibers are used at a level of at least 0.5% by volume. From the standpoints of product strength and the uniformity of film, the electroconductive fibers are used at a level of not more than 30% by volume.

Further, the blend percentage of the electroconductive fibers is correlated with the transparency of the resulting electroconductive film. Accordingly, when the electroconductive fibers are used in uses wherein transparency is required, the adjustment of the blend percentage according to the uses is carried out.

When the diameter of the electroconductive fibers is large, the opacity of the electroconductive film tends to reduce even at the same blend percentage. When it is desirable to ensure the opacity of not more than 30%, the amount of the electroconductive fibers can vary depending upon its diameter. When the diameter of the electroconductive fibers is from 5 to 10 μm, it is desirable that the electroconductive fibers are used at a level of not more than 7% by volume. When the diameter of the electroconductive fibers is from 10 to 15 μm, it is desirable that they are used at a level of not more than 12% by volume. When the diameter of the electroconductive fibers is from 15 to 20 μm, it is desirable that they are used at a level of not more than 30% by volume.

When widely used carbon fibers having a single yarn diameter of from about 10 to about 15 μm are used in order to obtain a film having a sufficient conductivity and an excellent transparency (an opacity of not more than 20%), it is desirable that the blend percentage of carbon fibers is from about 0.5 to about 6% by volume. (When this level is expressed by the weight ratio of the raw material of a mixed paper stock, the paper stock comprises from 94 to 60% by weight of a thermoplastic synthetic pulp, from 5 to 30% by weight of thermoplastic composite fibers, and from 1 to 10% by weight of carbon fibers.)

In the case of electromagnetic wave-shielding film, the film having a larger conductivity rather than transparency is required, and therefore it is desirable that the electroconductive fibers are used at a relatively high level.

Thermoplastic Composite Fibers

In the present invention, in addition to the raw materials described above, thermoplastic composite fibers consisting of a first component having a lower melting point than that of the thermoplastic synthetic pulp and a second component having a higher melting point than that of the thermoplastic synthetic pulp are used.

Thermoplastic composite fibers are fibers comprising at least two thermoplastic resins having different melting points, and are generally produced by means of composite spinning processes or the like. An example of the thermoplastic composite fibers is disclosed in Japanese Patent Publication No. 15684/1973. The first and second components of the composite fibers are suitably selected depending upon the melting point of a synthetic pulp selected from the above thermoplastic synthetic pulps. For example, a polyethylene synthetic pulp having a melting point of about 120° C. is used as the synthetic pulp, it is possible to use composite fibers wherein low density polyethelene having a lower melting point is a first component and polypropylene is a second component. In addition, polymers having a relatively low melting point such as ethylene-vinyl acetate copolymer and polyvinyl alcohol can be used as the first component, and polyester or the like can be used as the second component. The first and second components may be each the same type as that of synthetic pulp provided that there is a difference in melting points. In turn, if the composite fibers are determined, the thermoplastic synthetic pulp can be selected as those having a higher melting point than that of the first component and a lower melting point than that of the second component of the composite fibers.

The composite fibers can have a concentric or eccentric structure wherein the second component having a high melting point is a core and the first component having a low melting point is a clad; another structure wherein a core portion is exposed at the surface of fibers; and a further structure wherein the first and second components are continuously and irregularly composited. The form of the composite fibers is not restricted so long as, at a temperature at which the second component having a high melting point is not molten, the first component can be leached out to the exterior of the composite fibers so that other paper stock components are bonded each other in the compounding raw material of the base paper.

Further, in order to prevent the falling off in paper-making steps and to enable uniform blend, the composite fibers have preferably a fiber length of from about 2 to about 40 mm, more preferably from 3 to 15 mm, and a fineness of from 1 to 30 denier, preferably from 1.5 to 8 denier.

The above composite fibers are used at a level of from 5 to 30% by volume. If the level is less than 5% by volume, the reinforcing effect providing strength to a base paper is insufficient. While the tear strength of the base paper is increased with increasing the blend percentage of the composite fibers, at a level of 20% by volume or more, the degree of strength improvement slightly slows down. On the other hand, if the blend percentage is more than 30% by volume, a number of voids are generated in an electroconductive film obtained after heat-pressure treatment. Thus, a uniform film cannot be produced, and the strength of products is inferior. From the standpoints of characteristics of both the base paper and the electroconductive film, the particularly desired blend percentage is from 10% to 20% by volume.

Paper Pulps

Paper pulps such as chemical pulp can be further incorporated into the paper stock. In the case of some electroconductive fibers, compositions containing paper pulps such as chemical pulp can significantly increase the dissipation rate of charge of charged static electricity. In order to positively obtain such effects due to the paper pulp, it is desirable that the paper pulp is used at a level of at least 5% by volume of the paper stock. However, of course, compositions containing the paper pulp of less than 5% by volume are within the scope and spirit of the present invention, and can be used. In order to obtain a film having a low opacity, it is desirable that the blend percentage of paper pulp is not more than 30% by volume of the total weight of the thermoplastic synthetic pulp and the paper pulp (corresponding to not more than 29.5% by volume of total paper stock). Accordingly, the desired blend percentage of the paper pulp is from 5% to 20% by volume of total paper stock.

Paper pulps include chemical pulps such as sulfite pulp, sulfate pulp, soda pulp and dissolving pulp, semichemical pulp, chemigroundwood pulp, and groundwood pulp. Both bleached pulp and unbleached pulp can be used. In order to obtain a transparent film, bleached sulfite pulp and bleached sulfate pulp are desirable.

Process

In the present invention, a thermoplastic synthetic pulp is first mixed with electroconductive fibers and thermoplastic composite fibers. In mixing, the thermoplastic synthetic pulp is previously charged into warm water or the like, and stirred to defiberize, and the electroconductive fibers and composite fibers are also previously dispersed in water or the like, and thereafter they are mixed.

When paper pulps such as chemical pulp are incorporated as one component of raw materials, the beated pulp is mixed in the raw materials.

The mixed paper stock is throughly stirred to a uniform composition and fed to a papermaking step.

In papermaking, a paper machine comprising a wire part, press part and dryer part which is used in usual papermaking technology can be used.

A wet web formed from the above paper stock is heated and dried at the dryer part at a temperature of not less than the melting point of the first component of the thermoplastic composite fibers and below the melting point of the thermoplastic synthetic pulp to melt only the first component, thereby forming a base paper wherein the paper stock components are adhered each other. The resulting dried base paper is heated under pressure. The heating under pressure can be carried out by means of calendering, hot pressing or the like wherein gloss is imparted to paper and the surface is smoothed in conventional papermaking steps. The pressure conditions are suitably selected. The conventional calendering can be carried out under a linear pressure of from 40 to 200 kg/cm, whereas the hot pressing can be carried out under a pressure of from 60 to 200 kg/cm$^2$. If the same conditions are used, calendering for plastics can be also used.

The temperature used in heating under pressure is not less than the melting point of the thermoplastic synthetic pulp and below the second component of the thermoplastic composite fibers to melt the thermoplastic synthetic pulp and to form a thermoplastic synthetic resin matrix from this pulp. There is formed a network having dispersed the second component and the electroconductive fibers in the resulting electroconductive film.

In the film, the electroconductive fibers and the second component of the composite fibers are adhered each other in the thermoplastic synthetic resin matrix by the first component of the composite fibers which is solidified after the melting.

High strength materials and high melting matreials can be further included without departing from the scope or spirit of the present invention.

In the present invention, composite fibers comprising components having different melting points are incorporated into a paper stock and they are heated and dried in a first stage at a temperature wherein only first component having a low melting point is molten. Accordingly, the first component having a low melting point melts to perform a role as a binder which bond other paper stock components. While this first component is molten, the second component having a high melting point retains the form of fibers and exerts a reinforcing effect to increase the tensile strength and tear strength of the base paper. Further, the electroconductive film produced by heating under pressure in a second stage is formed by suitably adhering each paper stock component, and has an excellent strength by virtue of the reinforcing effect of the second component.

EXPERIMENTAL EXAMPLE 1

The following was used as a paper stock.
Thermoplastic synthetic pulp:
SWP ®UL-410 (polyethylene resin manufactured by Mitsui Sekiyu Kagaku, Japan, and having a melting point of 123° C., a specific gravity of 0.94, an average fiber length of 0.9 mm and a whiteness of 94% or more; hereinafter referred to as SWP)

Electroconductive fibers:
(1) Stainless steel fibers (manufactured by Nippon Yakin, Japan, and having an average fiber length of 3 mm and a diameter of 8 μm; hereinafter referred to as SSF) or
(2) Carbon fibers (Kureha Carbon Fiber Chip C-203 manufactured by Kureha Chemical Industry, Japan, graphitized grade and having a fiber length of 3 mm, a diamerer of 12.5 μm and a volume resistivity of $5.5 \times 10^{-3}$ ohm cm; hereinafter referred to as CF)

Composite Fibers:
NBF ®-E (clad-core type composite fibers manufactured by Daiwabo, Japan, consisting of a first component ethylene-vinyl acetate copolymer having a melting point of from 96° C. to 100° C. and a second component polypropylene having a melting point of from 165° C. to 170° C.; comprising a clad of the first component and a core of the second component; and having a fiber length of 5 mm and a fineness of 2 denier; hereinafter referred to as NBF)

A variety of sheets having a basis weight of 50 grams per square meter (g/m$^2$) were prepared by keeping only SSF at a constant amount of 0.6% by volume and varying the blend percentage of the remaining components (i.e., from 0% to 30% by volume of NBF and the balance SWP).

SWP, NBF and SSF were dispersed in water, respectively and the resulting dispersions were mixed to form a paper stock. Drying was carried out at a temperature of from 100° C. to 115° C. (this temperature was above the melting point of the low melting first component of NBF and below the melting point of SWP) to obtain a variety of base papers.

Base papers were produced in the same manner as described above except that CF was kept at a constant amount of 2.9% by volume in place of SSF.

Figure 2:
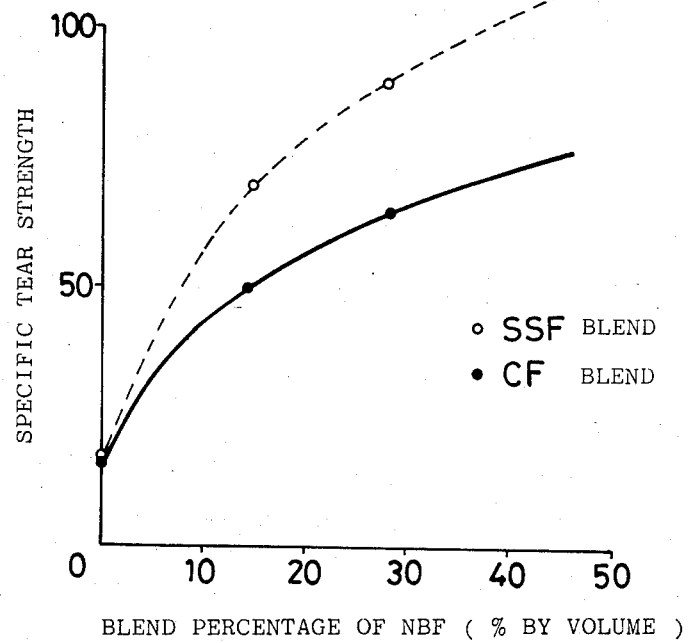
FIG. 2 is a graph representing the relation between the blend percentage of thermoplastic composite fibers and the specific tear strength of a base paper.

FIG. 1 shows the relationship between the blend percentage of NBF and a breaking length, and FIG. 2 shows the relationship between the blend percentage of NBF and a specific tear strength. In FIGS. 1 and 2, ○ represents a base paper obtained by using SSF, and ● represents a base paper obtained by using CF.

As can be seen from FIG. 1, if the blend percentage of NBF is less than 5% by volume, the breaking length is less improved. At a level of about 5% by volume, the breaking length begins to improve. If NBF is added at a level of 10% by volume or more, the breaking length is significantly improved. If the blend percentage is 20% by volume or more, the degree of the improvement of the breaking length slightly slows down. At a level of 30% by volume or more, the breaking length has reached a plateau.

As can be seen from FIG. 2, the specific tear strength is improved with increasing the blend percentage of NBF.

These base papers were then subjected to heat and pressure by means of supercalender for test to obtain transparent sheets. The supercalender conditions were a linear pressure of 60 kg/cm, a speed of 4.5 meters per minute, and a roll surface temperature of 130° C.

Figure 3:
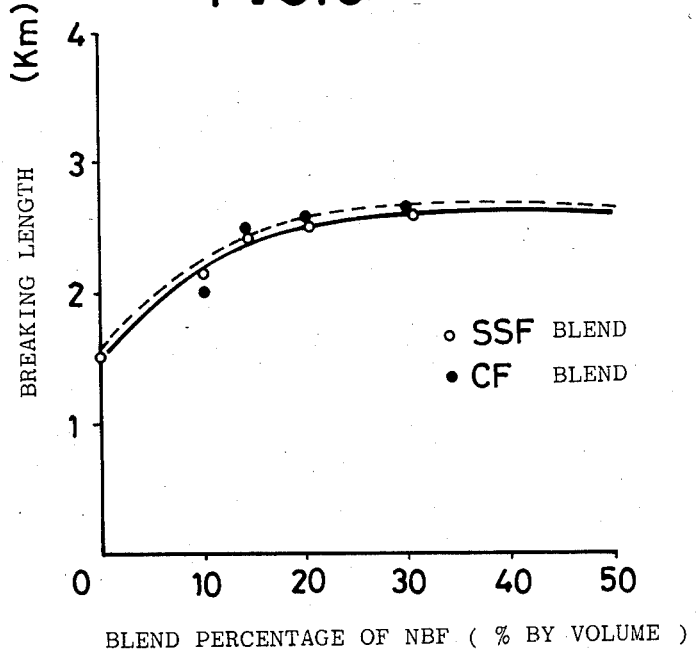
FIG. 3 is a graph representing the relationship between the blend percentage of thermoplastic composite fibers and the breaking length of an electroconductive film.
Figure 4:
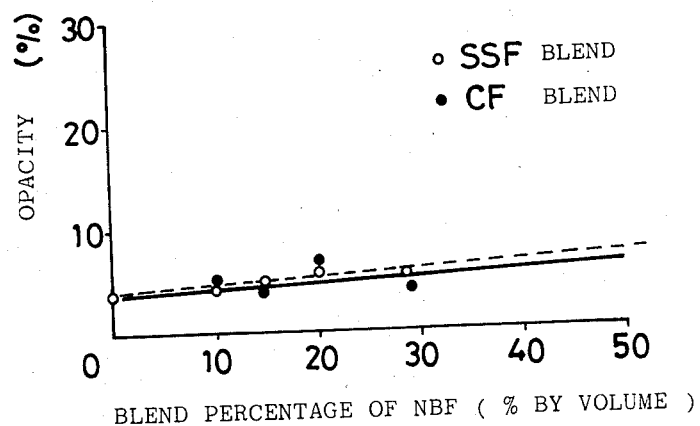
FIG. 4 is a graph representing the relationship between the blend percentage of thermoplastic composite fibers and the opacity of an electroconductive film.

FIGS. 3 and 4 show the relationship between the characteristics of filmy sheets and the blend percentage of NBF. In FIGS. 3 and 4, ○ represents a film obtained by using SSF and ● represents a film obtained by using CF.

As can be seen from FIG. 3, the breaking length is increased with increasing the blend percentage until the blend percentage of NBF is 20% by volume. At a level of more than 20% by volume, an approximately constant value is obtained.

As can be seen from FIG. 4, the opacity of the film is less than 10% regardless of the blend percentage of NBF, and films having a high transparency are obtained. The measurement of an opacity was carried out by means of a photovolt photoelectric reflect meter, model 670.

The volume resistivity of fiber oriented direction was measured according to SRIS 2301. There were no differences in volume resistivity of fiber oriented direction, static electrification voltage and cut off point of 50% (half-life) regardless of presence or absence of NBF. It has been found that NBF does not adversely affect the electrical characteristics of sheets.

As can be seen from the experimental results described above, the breaking length and specific tear strength required for operations such as papermaking of base papers and heating under pressure are obtained when the blend percentage of NBF is 5% by volume or more.

Further, it is observed that NBF can effectively increase the strength of the filmy sheet and does not adversely affect the electrical characteristics. However, NBF is in the form of rigid fibers, and therefore, if the blend percentage is more than 30% by volume, voids are generated in the film which has been heated under pressure. Thus, the desired film is not readily obtained. Accordingly, it is necessary that the blend percentage of NBF is not more than 30% by volume. From the standpoint of strength related to operability, the blend percentage of NBF is 5% by volume or more, desirably 10% by volume or more.

EXPERIMENTAL EXAMPLE 2

Four sheet-shaped films having a target basis weight 30 g/m$^2$, 50 g/m$^2$, 100 g/m$^2$ or 200 g/m$^2$ were prepared using paper stocks having the blend percentage (% by volume) of SWP/NBF/SSF of 62.8/26.9/10.3 (a weight ratio of 35/15/50). The characteristics of each film were shown in Table 1. The volume resistivity of fiber oriented direction was measured according to SRIS 2301 (the volume resistivity of fiber oriented direction described hereinafter was measured in the same manner as described above).

TABLE 1

| Target basis weight | 30 g/m$^2$ | 50 g/m$^2$ | 100 g/m$^2$ | 200 g/m$^2$ |
| --- | --- | --- | --- | --- |
| Basis weight (g/m$^2$) | 30.2 | 48.6 | 100.5 | 192.7 |
| Thickness (μm) | 36 | 57 | 101 | 192 |
| Density (g/m$^3$) | 0.84 | 0.85 | 1.00 | 1.00 |
| Opacity (%) | 18 | 30 | — | — |
| Volume resistivity of fiber oriented direction (ohm cm) | $1.3 \times 10^{-2}$ | $1.5 \times 10^{-2}$ | $1.6 \times 10^{-2}$ | $2.0 \times 10^{-2}$ |

As can be seen from the results shown in Table 1, even in the case of low basis weight products having a target basis weight of 30 g/m$^2$ and 50 g/m$^2$, the volume resistivity of oriented direction obtained is comparable to that of high basis weight products. Further, the low basis weight products exhibited a smaller opacity, and therefore it is possible to use them in fields wherein the transparency is required.

Figure 5:
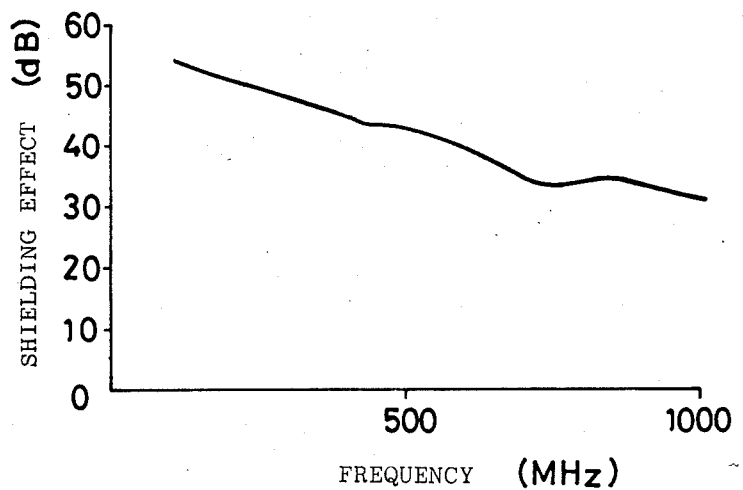
FIG. 5 is a graph showing the electromagnetic wave-shielding effect (electric field) of an electroconductive film.

For the electroconductive film having a basis weight of 50 g/m$^2$ shown in Table 1, each frequency (MHz) shielding effect (electric field) was then measured using an apparatus for evaluating plastic shield materials (marketed by Takeda Riken Kogyo, Japan, under the name TR 17301). The results obtained are shown in FIG. 5. As can be seen from FIG. 5, at regions up to 1000 MHz, an electromagnetic wave-shielding effect is obtained at 30 dB or more. For a shielding effect (magnetic field), an approximately similar effect was observed.

EXPERIMENTAL EXAMPLE 3

SWP was used as the thermoplastic pulp; NBF was used as the thermoplastic composite fibers; CF was used as the electroconductive fibers; and NBKP [Soft-wood Bleached Sulfate Pulp obtained by beating with 300 ml CSF (Canadian Standard Freeness Tester)] was used as the paper pulp. Base papers and electroconductive films were prepared in the same manner as described in Experimental Example 1.

Figure 6:
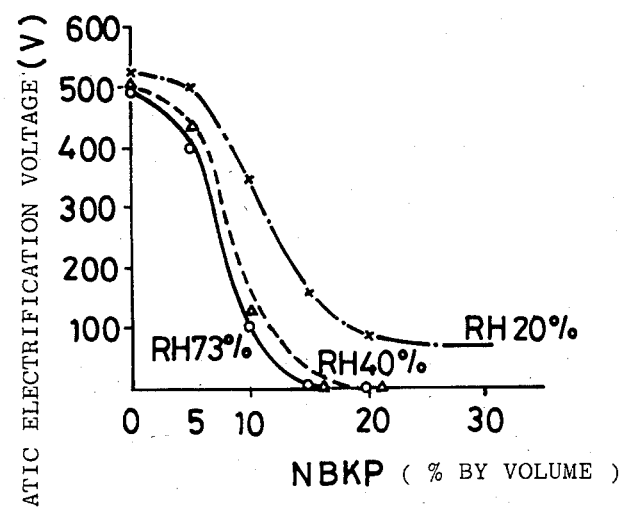
FIG. 6 is a graph representing the relationship between the blend percentage of a paper pulp and the static electrification voltage of an electroconductive film.

A variety of sheet shaped films were prepared by keeping NBF and CF at a constant amount of 15.3% by volume and 2.9% by volume, respectively and varing the blend percentage of the remaining components (i.e., from 0% to 30% by volume of NBKP and the balance SWP). The static electrification voltage of films was measured under various humidity conditions. The results obtained are shown in FIG. 6. Table 2 compares the film containing no NBKP with the film containing 20.4% by volume of NBKP. The static electrification voltage and half-life were measured under the conditions of a temperature of 25° C., a discharge spacing of 2 cm, an applied pressure of 8 KV and an applied period of 1 minute by means of Static Honestmeter Type S-5109 (manufactured by Shishido Shokai, Japan).

TABLE 2

Influence of Blend Percentage of NBKP on Static Electrification Voltage (V max) and Half-life ($\tau \frac{1}{2}$)

| Relative humidity | | | RH 73% | RH 40% | RH 20% |
| --- | --- | --- | --- | --- | --- |
| Blend percentage of NBKP (% by volume) | 0 | V max | 490 | 530 | 550 |
| | | $\tau \frac{1}{2}$ | at least 180 seconds | at least 180 seconds | at least 180 seconds |
| | 20.4 | V max | 0V | 0V | 96V |
| | | $\tau \frac{1}{2}$ | 0 second | 0 second | 102 seconds |

As can be seen from FIG. 6, if NBKP is incorporated at a level of 5% by volume or more under each humidity condition, the static electrification voltage is rapidly reduced. Particularly, in an atmosphere having a humidity of 40% or more, static electrification voltage of 0 V can be achieved by incorporating 15% by volume of NBKP. This is because the chemical pulp retains moisture.

As can be seen from FIG. 6, the electrical charactristics of the NBKP-contaiting film exhibit humidity dependence. However, it is observed that the static electrification voltage is sufficiently reduced in a low humidity atmosphere (a humidity of 20%). As can be seen from the results shown in Table 2, both the static electrification voltage and the half-life are reduced by incorporating NBKP.

Figure 7:
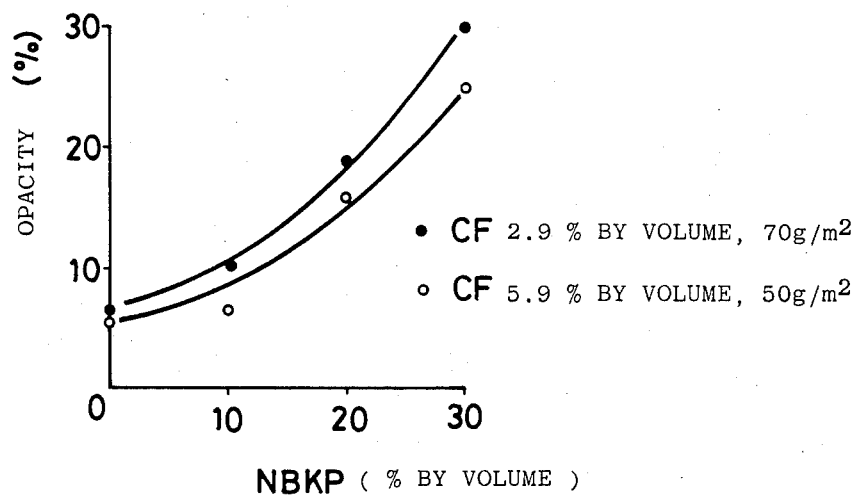
FIG. 7 is a graph representing the blend percentage of a paper pulp and the opacity of an electroconductive film.

FIG. 7 shows the relationship between the opacity of filmy sheets and the blend percentage of NBKP wherein one sheet has a basis weight of 50 g/m² and 2.9% by volume of CF and the other sheet has a basis weight of 70 g/m² and 5.9% by volume of CF. In FIG. 7, ○ represents the sheet having a basis weight of 50 g/m² and 2.9% by volume of CF, and ● represents the sheet having a basis weight of 70 g/m² and 5.9% by volume of CF. In both cases, the opacity proportionally increases with increasing the blend percentage of NBKP and the transparency is impaired.

In order to effectively improve the electrical characteristics within the range capable of considering visually as being transparent (i.e., an opacity of 30% or below), it is desirable that the blend percentage of the chemical pulp is not more than 20% by volume of the total paper stock.

EXAMPLE 1

A constant amount of SWP was charged into warm water at 50° C. as a thermoplastic synthetic pulp to a concentration of 3% and defiberized by means of a stirrer. Further, a constant amount of NBF was dispersed in water at ambient tempareture as thermoplastic composite fibers. Furthermore, SSF was dispersed in water at ambient temperature as electroconductive fibers to form a dispersion having a concentration of 1%, and a small amount of a defoaming agent was added to the dispersion. The foregoing dispersions were collected so that the blend percentage of SWP/NBF/SSF (% by volume) was 82.2/16.5/1.3 (a weight ratio of 75/15/10). The dispersions were placed in a mixer, and a mixture was stirred for 20 minutes or more. A small amount of a dispersing agent was added to the raw materials, and a base paper having a target basis weight of 50 g/m² was prepared by means of a test machine. The drying of the base paper was carried out at a temperature of from 100° C. to 115° C. wherein such a temperature was same or above the melting point of the clad component of NBF (from 96° C. to 100° C.) and below the melting point of SWP (123° C.). The production speed was 30 meters per minute. Even if the dryer was not subjected to particularly a releasing treatment, the release from the dryer was good and the base paper was readily continuously produced without any break. This base paper was subjected to a supercalender treatment under a linear pressure of 60 kg/cm at a roll surface temperature of 130° C. which was above the melting point of SWP (123° C.) and below the melting point of the core component of NBF (from 165° C. to 170° C.). The speed thereof was adjusted to 4.5 m/min constantly.

For comparison, the blend percentage of SWP/NBF/SSF (% by volume) of 98.7/0/1.3 (a weight ratio of 90/0/10) was used. That is to say, while the blend percentage of SSF was the same as described in Example, no NBF was contained. A base paper and an electroconductive film were produced in the same manner as described in Example. However, the paper strength was feeble and therefore break occurred. Thus, it was extremely difficult to continuously produce the electroconductive film.

The physical properties of the base papers and the electroconductive films of this Example and Comparative Example are shown in Table 3.

TABLE 3

| SWP/NBF/SSF (% by volume) | 82.2/16.5/1.3 | | Comparative Example 98.7/0/1.3 | |
| --- | --- | --- | --- | --- |
| | Base paper | Electro-conductive film | Base paper | Electro-conductive film |
| Basis weight (g/m²) | 46.2 | 46.6 | 48.3 | 49.5 |
| Thickness (μm) | 118 | 58 | 121 | 61 |
| Density (g/cm³) | 0.39 | 0.80 | 0.40 | 0.81 |
| Opacity (%) | 96.3 | 5.5 | 96.0 | 5.3 |
| Air permeability (second/100 ml) | 2 | at least 100,000 | 2 | at least 100,000 |
| Breaking length (longitudinal) (Km) | 0.63 | 2.25 | 0.23 | 1.50 |
| Specific tear strength (longitudinal) | 69.2 | — | 23.0 | — |
| Heat seal strength (longitudinal) (g/10 mm) | — | 800 | — | 850 |
| Volume resistivity of fiber oriented direction (ohm cm) | — | $2.7 \times 10^0$ | — | $3.1 \times 10^0$ |
| Water vapor permeability (g/m²/24 hours) | — | 14.8 | — | 15.7 |

The heat seal strength in Table was measured according to TAPPI Standard T 517-69, and the strength test was carried out by a universal tension tester Tensilon (manufactured by Toyo Baldwin K.K., Japan). Table 2 exhibits that electroconductive film having a low opacity and a good heat seal strength is obtained. The comparison with Comparative Example exhibits that the strength is significantly improved by substituting NBF for a portion of SWP. Particularly in the base paper, the breaking strength and specific tear strength are increased at least twice and at least 3 times, respectively by the incorporation of NBF. Due to such facts, the base paper is readily continuously produced. The resulting film had an opacity of 5.5% and was comparable to conventional transparent plastic films. Further, the resulting electroconductive film was suitably used as films for the prevention of static electricity trouble.

EXAMPLE 2

A base papers and an electroconductive film were obtained in the same manner as described in Example 1 except that the blend percentage of SWP/NBF/SSF (% by volume) was 83.7/15.7/0.6 (a weight ratio of 80/15/5) and the target basis weight was 25 g/m$^2$ or 50 g/m$^2$. The physical properties are shown in Table 4.

When the blend percentage of SSF was increased and the basis weight was increased to 70 g/m$^2$, the transparency becomes inferior. However, such a product exhibited a 43 dB shielding effect against electromagnetic wave having a frequency of 500 KHz and a 30 dB shielding effect against electromagnetic wave having a frequency of 1 GHz. Thus, the resulting electroconductive film could be suitably used as electromagnetic wave-shielding materials.

EXAMPLE 4

An electroconductive film was obtained in the same manner as described in Example 1 except that the blend percentage of SWP/NBF/SSF (% by volume) was 87.2/10/2.8 and the target basis weight was 50 g/m$^2$. As with Example 1. the electroconductive film could be readily continuously produced. The resulting electroconductive film had a basis weight of 51.2 g/m$^2$, an opacity of 6.5%, a volume resistivity of fiber oriented Table 4

|  | Product having a target basis weight of 25 g/m$^2$ | | Product having a target basis weight of 50 g/m$^2$ | |
| --- | --- | --- | --- | --- |
|  | Base paper | Electroconductive film | Base paper | Electroconductive film |
| Basis weight (g/m$^2$) | 25.8 | 26.0 | 48.8 | 50.2 |
| Thickness (μm) | 68 | 31 | 122 | 55 |
| Density (g/cm$^3$) | 0.38 | 0.87 | 0.40 | 0.92 |
| Opacity (%) | 90.1 | 3.2 | 96.5 | 3.5 |
| Air permeability (second/100 ml) | 1 | 100,000 or more | 2 | 100,000 or more |
| Breaking length (longitudinal) (Km) | 0.55 | 2.32 | 0.65 | 2.51 |
| Specific tear strength (longitudinal) | 45 | 43 | 70 | 42 |
| Heat seal strength (longitudinal) (g/10 mm) | — | 530 | — | 810 |
| Volume resistivity of fiber oriented direction (ohm cm) | — | $2.4 \times 10^1$ | — | $2.1 \times 10^1$ |
| Water vapor permeability (g/m$^2$/24 hours) | — | 32.0 | — | 15.0 |

The strength of the base papers was improved by the incorporation of NBF, and as with Example 1, the product having a low basis weight of 25 g/m$^2$ was readily continuously produced.

The low incorporation of SSF provides a low opacity, and the volume resistiviry of fiber oriented direction is sufficiently small.

The resulting electroconductive films could be suitably used as a bag for the prevention of dust deposition on electronic components.

EXAMPLE 3

An electroconductive film was obtained in the same manner as described in Example 1 except that the blend percentage of SWP/NBF/SSF (% by volume) was 62.8/26.9/10.3 and the target basis weight was 70 g/m$^2$. As with Example 1, the electroconductive film could be readily continuously produced. The resulting electroconductive film had a basis weight of 69.5 g/m$^2$, an opacity of 39.5%, a volume resistivity of fiber oriented direction of $1.5 \times 10^{-2}$ ohm cm and a breaking length of 2.43 km.

direction of $7.5 \times 10^{-1}$ ohm cm and a breaking length of 1.95 km.

EXAMPLE 5

A base paper and an electroconductive film were prepared in the same manner as described in Example 1 except that CF was used as the electroconductive fibers and the blend percentage of SWP/NBF/CF (% by volume) was 82.1/15.0/2.9 (a weight ratio of 80/15/5). As with Example 1, the release from the dryer was good, and the electroconductive film could be readily continuously produced without any break.

For comparison, the blend percentage of SWP/NBF/CF (% by volume) of 97.1/0/2.9 (a weight ratio of 95/0/5) was used to prepare a base paper and an electroconductive film. In this case, break occurred and it was difficult to continuously produce the electroconductive film.

The physical properties of the base papers and the electroconductive films of this Example and Comparative Example are shown in Table 5. The measurement of each physical property was carried out in the same manner as described in Example 1.

TABLE 5

| SWP/NBF/SSF (% by volume) | 82.1/15.0/2.9 | | Comparative Example 97.1/0/2.9 | |
|---|---|---|---|---|
| | Base paper | Electro-conductive film | Base paper | Electro-conductive film |
| Basis weight (g/m²) | 49.5 | 50.2 | 49.2 | 50.8 |
| Thickness (μm) | 138 | 59 | 132 | 57 |
| Density (g/cm³) | 0.36 | 0.85 | 0.35 | 0.89 |
| Opacity (%) | 95.8 | 5.0 | 96.1 | 3.9 |
| Air permeability (second/100 ml) | 2 | at least 100,000 | 2 | at least 100,000 |
| Breaking length (longitudinal) (Km) | 0.55 | 2.33 | 0.20 | 1.50 |
| Specific tear strength (longitudinal) | 50 | — | 15 | — |
| Heat seal strength (longitudinal) (g/10 mm) | — | 800 | — | 820 |
| Volume resistivity of fiber oriented direction (ohm cm) | — | $2.50 \times 10^0$ | — | $2.24 \times 10^0$ |
| Water vapor permeability (g/m²/24 hours) | — | 17.2 | — | 15.3 |
| Static electrification voltage (V) | — | 530 | — | 470 |
| Half-life (second) | — | at least 180 | — | at least 180 |

The comparison with Comparative Example exhibits that the strength is significantly improved by substituting NBF for a portion of SWP. Particularly in the base paper, the breaking strength and specific tear strength are increased at least twice and 3 times, respectively by the incorporation of NBF. Due to such facts, the base paper is readily continuously produced. The resulting electroconductive film had an opacity of 5% and was comparable to conventional transparent plastic films. Further, the resulting electroconductive film was suitably used as a film for the prevention of static electrcity hindrance.

EXAMPLE 6

Base papers and electroconductive films were obtained in the same manner as described in Example 1 except that the blend percentage of SWP/NBF/CF (% by volume) was 80.7/18.2/1.1 (a weight ratio of 80/18/2) and the target basis weight was 30 g/m² or 50 g/m². The physical properties are shown in Table 6.

TABLE 6

| | Product having a target basis weight of 30 g/m² | | Product having a target basis weight of 50 g/m² | |
|---|---|---|---|---|
| | Base paper | Electro-conductive film | Base paper | Electro-conductive film |
| Basis weight (g/m²) | 32.3 | 31.5 | 51.2 | 50.6 |
| Thickness (μm) | 98 | 38 | 146 | 59 |
| Density (g/cm³) | 0.33 | 0.83 | 0.35 | 0.86 |
| Opacity (%) | 90.5 | 3.5 | 97.0 | 4.8 |
| Air permeability (second/100 ml) | 1 | at least 100,000 | 2 | at least 100,000 |
| Breaking length (longitudinal) (Km) | 0.60 | 2.22 | 0.65 | 2.41 |
| Specific tear strength (longitudinal) | 49 | 30 | 58 | 35 |
| Heat seal strength (longitudinal) (g/10 mm) | — | 635 | — | 790 |
| Volume resistivity of fiber oriented direction (ohm cm) | — | $5 \times 10^7$ | — | $1 \times 10^7$ |
| Water vapor permeability (g/m²/24 hours) | — | 30.8 | — | 15.3 |

The strength of the base papers was improved by the incorporation of NBF, and as with Example 1, the product having a low basis weight of 30 g/m² was readily continuously produced.

While the low incorporation of CF provides a low opacity, the volume resistivity of fiber oriented direction is $10^7$ ohm cm. This exhibits that such a blend percentage of CF is approximately the lower limit of CF. The resulting electroconductive films could be suitably used as a bag for the prevention of dust deposition on electronic components.

EXAMPLE 7

An electroconductive film was obtained in the same manner as described in Example 1 except that the blend percentage of SWP/NBF/CF (% by volume) was 62.7/31.4/5.9 (a weight ratio of 60/30/10) and the target basis weight was 70 g/m². As with Example 1, the electroconductive film could be readily continuously produced. The resulting electroconductive film had a basis weight of 70.2 g/m², an opacity of 9.5%, a volume resistivity of fiber oriented direction of $6.2 \times 10^{-1}$ ohm cm and a breaking length of 2.52 km.

Even if the blend percentage of NBF and CF is increased and the basis weight is increased to 70 g/m², the electroconductive film is a good transparent electroconductive film although it has a slightly high opacity. The electroconductive film could be suitably used as low frequency electromagnetic wave-shielding materials.

EXAMPLE 8

An electroconductive film was obtained in the same manner as described in Example 1 except that the blend percentage of SWP/NBF/CF (% by volume) was 85.0/10.3/4.7 (a weight ratio of 82/10/8) and the target basis weight was 50 g/m². As with Example 1, the electroconductive film could be readily continuously produced. The resulting electroconductive film had a basis weight of 50.2 g/m$^2$, an opacity of 7.1%, a breaking length of 2.0 km, and a volume resistivity of fiber oriented direction of 9.5×10$^{-1}$ ohm cm. It was a good transparent electroconductive film.

The resulting transparent electroconductive film had an excellent strength, and no film cutting occurred during bag making.

EXAMPLE 9

SWP, NBF and CF were defiberized in the same manner as described in Example 1. Further, soft wood bleached sulfate pulp (referred to as NBKP) as chemical pulp was beated by means of a test beater until the beating degree was 300 ml CSF.

Base papers were produced by means of a test machine and electroconductive films were produced by means of a supercalender in the same manner as described in Example 1 except that the blend percentage of SWP/NBF/NBKP/CF (% by volume) was 66.5/15.3/15.3/2.9 (a weight ratio of 65/15/15/5) and the target basis weight was 30 g/m$^2$ or 50 g/m$^2$. The base papers were readily continuously produced and the supercalender processability exhibited no problem. The physical properties of the base papers and the electroconductive films are shown in Table 7.

TABLE 7

|  | Product having a target basis weight of 30 g/m$^2$ | | Product having a target basis weight of 50 g/m$^2$ | |
| --- | --- | --- | --- | --- |
|  | Base paper | Electro-conductive film | Base paper | Electro-conductive film |
| Basis weight (g/m$^2$) | 29.7 | 30.8 | 49.5 | 50.3 |
| Thickness (μm) | 74 | 35 | 121 | 56 |
| Density (g/cm$^3$) | 0.40 | 0.88 | 0.41 | 0.90 |
| Opacity (%) | 90.2 | 6.5 | 95.8 | 10.5 |
| Air permeability (second/100 ml) | 1 | at least 100,000 | 2 | at least 100,000 |
| Breaking length (longitudinal) (Km) | 0.58 | 2.31 | 0.63 | 2.52 |
| Specific tear strength (longitudinal) | 53 | — | 55 | — |
| Heat seal strength (longitudinal) (g/10 mm) | — | 670 | — | 740 |
| Volume resistivity of fiber oriented direction (ohm cm) | — | 5.76 × 10$^0$ | — | 2.43 × 10$^0$ |
| Water vapor permeability (g/m$^2$/24 hours) | — | 58 | — | 25 |
| Static electrification voltage (V) | — | 0 | — | 0 |
| Half-life (second) | — | 0 | — | 0 |

As can be seen from Table 7, the transparency is retained and transparent electroconductive films having a volume resistivity of fiber oriented direction of 10$^0$ ohm cm are obtained. Particularly, the static electrification voltage is effectively reduced. That is to say, as shown in Table 2 of Experimental Example 3, the electroconductive film havint the blend percentage of SWP/NBF/CF (% by volume) of 81.8/15.3/2.9 (a weight ratio of 80/15/5) have a static electrification voltage of 530 V and a half-life of at least 180 seconds, whereas the present electroconductive films having a basis weight of 30 g/m$^2$ or 50 g/m$^2$ have a static electrification voltage of 0 (at a temperature of 25° C., and under a relative humidity of 40%). Thus, the electroconductive films containing 15% by volume of chemical pulp exhibit an excellent discharge effect.

EXAMPLE 10

An electroconductive film was obtained in the same manner as described in Example 9 except that the blend percentage of SWP/NBF/NBKP/CF (% by volume) was 71.6/15.3/10.2/2.9 (a weight ratio of 70/15/10/5) and the target basis weight was 30 g/m$^2$. The electroconductive film was continuously produced without any problem. The resulting electroconductive film had a basis weight of 29.7 g/m$^2$, an opacity of 5.3%, a breaking length of 2.31 km, and a volume resistivity of fiber oriented direction 5.5×10$^0$ ohm cm. The opacity was reduced by using a low basis weight, and the static electrification voltage was 0 V (at a temperature of 25° C. and under a relative humidity of 40%). As with the high basis weight products, the discharge characteristics were good.

EXAMPLE 11

A base paper and an electroconductive film were produced in the same manner as described in Example 1 except that NBF as composite fibers was replaced by ES-Chop®-EA (polyethylene/polypropylene composite fibers manufactured by Chisso K.K., Japan and having a melting point of a lower melting portion of from 100° C. to 110° C., a melting point of a higher melting portion of from 165° C. to 170° C., a fiber length of 5 mm and a fineness of 3 denier;) (hereinafter referred to as ES), the blend percentage of SWP/ES/SSF (% by volume) was 77.2/20/2.8 and the target basis weight was 50 g/m$^2$. The drying temperature of the base paper was set at a temperature above the melting point of the lower melting portion of ES (100° C.–110° C.) and below the melting point of SWP (123° C.). The electroconductive film was readily continuously produced by virtue of the fusion effect. The resulting electroconductive film had a basis weight of 49.5 g/m$^2$, an opacity of 6.8%, a breaking length of 2.38 km, and a volume resistivity of fiber oriented direction of 6.7×10$^{-1}$ ohm cm.

EXAMPLE 12

A base paper and an electroconductive film having a target basis weight of 50 g/m$^2$ were produced in the same manner as described in Example 11 except that the blend percentage of SWP/ES/CF (% by volume) was 76.7/20.4/2.9 (a weight ratio of 75/20/5). The resulting electroconductive film had a basis weight of 49.7 g/m$^2$, an opacity of 5.5%, a breaking length of 2.43 km and a volume resistivity of fiber oriented direction of 3.57×10$^0$ ohm cm.

EXAMPLE 13

An electroconductive film was produced in the same manner as described in Example 5 except that the blend percentage of SWP/ES/NBKP/CF (% by volume) was 66.5/15.3/15.3/2.9 (a weight ratio of 65/15/15/5), and the target basis weight of 50 g/m². The electroconductive film was continuously produced without any problem. The resulting electrconductive film had a basis weight of 50.2 g/m², an opacity of 11.2%, a breaking length of 2.41 km, a volume resistivity of fiber oriented direction of $3.91 \times 10^{\circ}$ ohm cm and a static electrification voltage of 0 V (at a temperature of 25° C. and under relative humidity of 40%). The resulting electroconductive film was a transparent electroconductive film having excellent discharge characteristics.

EXAMPLE 14

Three electroconductive films were produced in the same manner as described in Example 1 except that the electroconductive fibers used were nickel-coated fibers wherein the surface of carbon fibers (pitch-type carbon fibers manufactured by Kureha Chemical Industry Co., Ltd., Japan and having an average fiber length of 6 mm and a single yarn diameter of 12.5 μm) was coated with nickel (a thickness of about 1 μm) by means of chemical plating (hereinafter referred to as Ni-CF), and SWP, NBF and Ni-CF were incorporated at each blend percentage shown in Table 4.

Physical properties of each electroconductive film are shown in Table 8.

TABLE 8

| | Blend percentage of SWP/NBF/Ni—CF | | |
|---|---|---|---|
| % by volume (% by weight) | 83.9/15.3/0.8 (82/15/3) | 83/15.6/1.4 (80/15/5) | 80.9/16.2/2.9 (75/15/10) |
| Basis weight (g/m²) | 50.6 | 49.5 | 49.8 |
| Thickness (μm) | 58 | 63 | 60 |
| Density (g/cm³) | 0.87 | 0.79 | 0.83 |
| Opacity (%) | 5.0 | 6.8 | 14.0 |
| Air permeability (second/100 ml) | ∞ | ∞ | 60000 |
| Breaking length (longitudinal) (Km) | 2.41 | 2.35 | 2.20 |
| Volume resistivity of fiber oriented direction (ohm cm) | $5.2 \times 10^2$ | $3.0 \times 10^1$ | $1.7 \times 10^0$ |

Because the present invention has actions or functions as described above, the following effects or advantages are obtained.

(1) Because the tensile strength and tear strength of the base paper or film are improved, the film can be taken off from the dryer at a high speed in the paper making step, and continuous production and processing of the sheet-shaped electroconductive film can be readily carried out without breaking the base paper and film.

(2) It is possible to produce a thinner film as compared with the prior art film. It is also possible to produce a film having a low basis weight of the order of no more than 70 g/m², particularly from 50 to 20 g/m².

(3) As described above, it is possible to produce a thin film. As a result, a film having a high conductivity can be obtained even if the amount of electroconductive fibers used is small.

(4) As described above, it is possible to produce a thin film containing a small amount of the electroconductive fibers. As a result, a packaging film having a more excellent transparency can be provided.

(5) Due to the improvement of strength, a large amount of electroconductive fibers can be incorporated into even a thin film having a low basis weight. As a result, an electromagnetic wave-shielding film can be provided.

(6) Consequently, films having a variety of charactristics according to uses can be produced by adjusting the blend percentage of each paper stock component, the basis weight, the thickness and the like.

Among the electroconductive films produced according to the process of the present invention, those having a volume resistivity of fiber oriented direction of from $10^8$ to $10^0$ ohm cm are suitable as bags for the prevention of dust deposition on electronic components or as films for the prevention of static electricity troubles, and those having a volume resistivity of fiber oriented direction of not more than $10^0$ ohm cm are suitable in uses wherein the electromagnetic wave-shielding effect is required.

We claim:

1. A process for producing an electroconductive film having a volume resistivity in a fiber oriented direction of not more than $1 \times 10^8$ ohm cm which comprises the steps of forming a wet web by papermaking, with a papermaking machine, from a paper stock obtained by mixing from 94.5% to 40% by volume of a thermoplastic synthetic pulp of a single thermoplastic synthetic resin with from 5% to 30% by volume of thermoplastic composite fibers comprising a first component having a lower melting point than that of said thermoplastic synthetic pulp and a second component having a higher melting point than that of said thermoplastic synthetic pulp, and from 0.5% to 30% by volume of electroconductive fibers; then heating and drying said wet web at a temperature of not less than the melting point of said first component and below the melting point of said thermoplastic synthetic pulp to melt the first component, thereby forming a base paper wherein the paper stock components are adhered to each other; and thereafter heating said base paper under pressure at a temperature of not less than the melting point of said thermoplastic synthetic pulp and below the melting point of said second component to melt the thermoplastic synthetic pulp, thereby forming a film having dispersed said second component and said electroconductive fibers therein.

2. The process according to claim 1 wherein the film having dispersed the second component and the electroconductive fibers therein has an opacity of not more than 30%.

3. The process according to claim 1 wherein the basis weight of the film having dispersed the second component and the electroconductive fibers therein is not more than 70 grams per square meter.

4. The process according to claim 1 wherein the electroconductive fibers are carbon fibers.

5. The process according to claim 1 wherein the electroconductive fibers are metallic fibers.

6. The process according to claim 1 wherein the electroconductive fibers are metal-coated fibers.

7. The process according to claim 5 wherein the metallic fibers are stainless steel fibers.

8. The process according to claim 6 wherein the metal-coated fibers are nickel-coated carbon fibers.

9. The process according to claim 1 wherein the thermoplastic composite fibers are composite fibers having a concentric structure wherein the second component is a core and the first component is a clad.

10. The process according to claim 1 wherein the themoplastic composite fibers are composite fibers having an eccentric structure wherein the second component is a core and the first component is a clad.

11. The process according to claim 1 wherein a paper pulp is incorporated into the paper stock.

12. An electroconductive film having a volume resistivity of fiber oriented direction of not more than $1 \times 10^8$ ohm cm, wherein electroconductive fibers and a non-melted second component of thermoplastic composite fibers are dispersed in a thermoplastic synthetic resin matrix formed from a thermoplastic synthetic pulp, and wherein said electroconductive fibers and said second component of thermoplastic composite fibers are adhered to each other by a first component of said thermoplastic composite fibers, produced by the process comprising the steps of forming a wet web by papermaking, with a papermaking machine, from a paper stock obtained by mixing from 94.5% to 40% by volume of a thermoplastic synthetic pulp of a single thermoplastic synthetic resin with from 5% to 30% by volume of thermoplastic composite fibers comprising a first component having a lower melting point than that of said thermoplastic synthetic pulp and a second component having a higher melting point than that of said thermoplastic synthetic pulp, and from 0.5% to 30% by volume of electroconductive fibers; then heating and drying said wet web at a temperature of not less than the melting point of said first component and below the melting point of said thermoplastic synthetic pulp to melt the first component, thereby forming a base paper wherein the paper stock components are adhered to each other; and thereafter heating said base paper under pressure at a temperature of not less than the melting point of said thermoplastic synthetic pulp and below the melting point of said second component to melt the thermoplastic synthetic pulp, thereby forming a film having dispersed said second component and said electroconductive fibers therein.

* * * * *

UNITED STATES PATENT AND TRADEMARK OFFICE
CERTIFICATE OF CORRECTION

PATENT NO. : 4,645,566

DATED : February 24, 1987

INVENTOR(S) : Kato et al.

It is certified that error appears in the above-identified patent and that said Letters Patent is hereby corrected as shown below:

Title page, column 1, next to "[73] Assignee:" please change "Mushima" to -- Mishima --.

Signed and Sealed this

Eighth Day of September, 1987

Attest:

DONALD J. QUIGG

*Attesting Officer*  *Commissioner of Patents and Trademarks*